United States Patent [19]

Au

[11] 4,003,034

[45] Jan. 11, 1977

[54] SENSE AMPLIFIER CIRCUIT FOR A RANDOM ACCESS MEMORY

[75] Inventor: Alexander C. Au, Los Gatos, Calif.

[73] Assignee: Fairchild Camera and Instrument Corporation, Mountain View, Calif.

[22] Filed: May 23, 1975

[21] Appl. No.: 580,256

[52] U.S. Cl. .......................... 340/173 CA; 357/41
[51] Int. Cl.² .................................. G11C 11/44
[58] Field of Search .............. 340/173 R, 173 CA; 357/41, 54, 23

[56] References Cited

UNITED STATES PATENTS

| | | | |
|---|---|---|---|
| 3,380,035 | 4/1968 | Hecker | 340/173 R |
| 3,662,356 | 5/1972 | Michon et al. | 357/41 |
| 3,756,876 | 9/1973 | Brown et al. | 357/54 |
| 3,831,155 | 8/1974 | Tamaru et al. | 340/173 R |
| 3,838,405 | 9/1974 | Arnett | 340/173 R |
| 3,906,539 | 9/1975 | Sauermann et al. | 357/54 |

*Primary Examiner*—Marshall M. Curtis
*Attorney, Agent, or Firm*—Alan H. MacPherson; J. Ronald Richbourg

[57] ABSTRACT

An improved sense amplifier circuit for a Random Access Memory (RAM) having 1-transistor memory cells which is completely dynamic in that it does not dissipate D.C. power during operation and is suitable for location at one end of a memory cell array. The trip-point voltage of the sense amplifier is controlled by a pair of capacitances. When the Random Access Memory (RAM) is fabricated as an integrated circuit these control capacitances are so structured and processed that the trip-point voltage tracks with the sense amplifier input signal voltages over a wide range of manufacturing process parameter variations.

11 Claims, 7 Drawing Figures

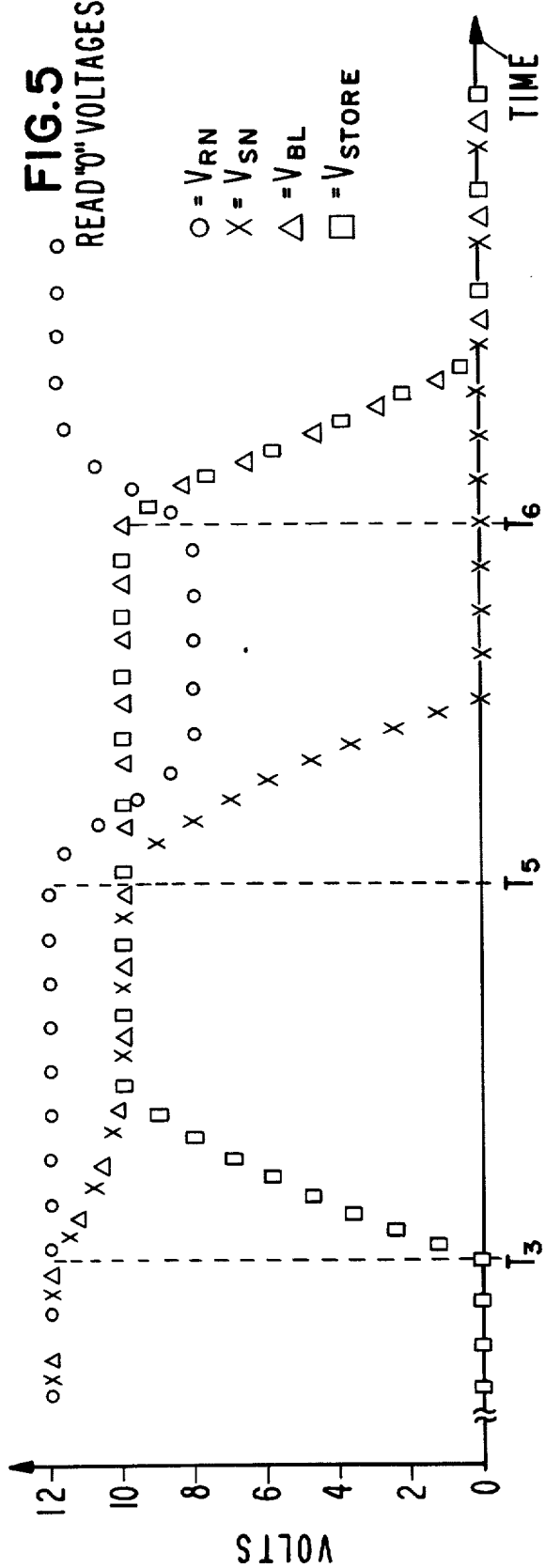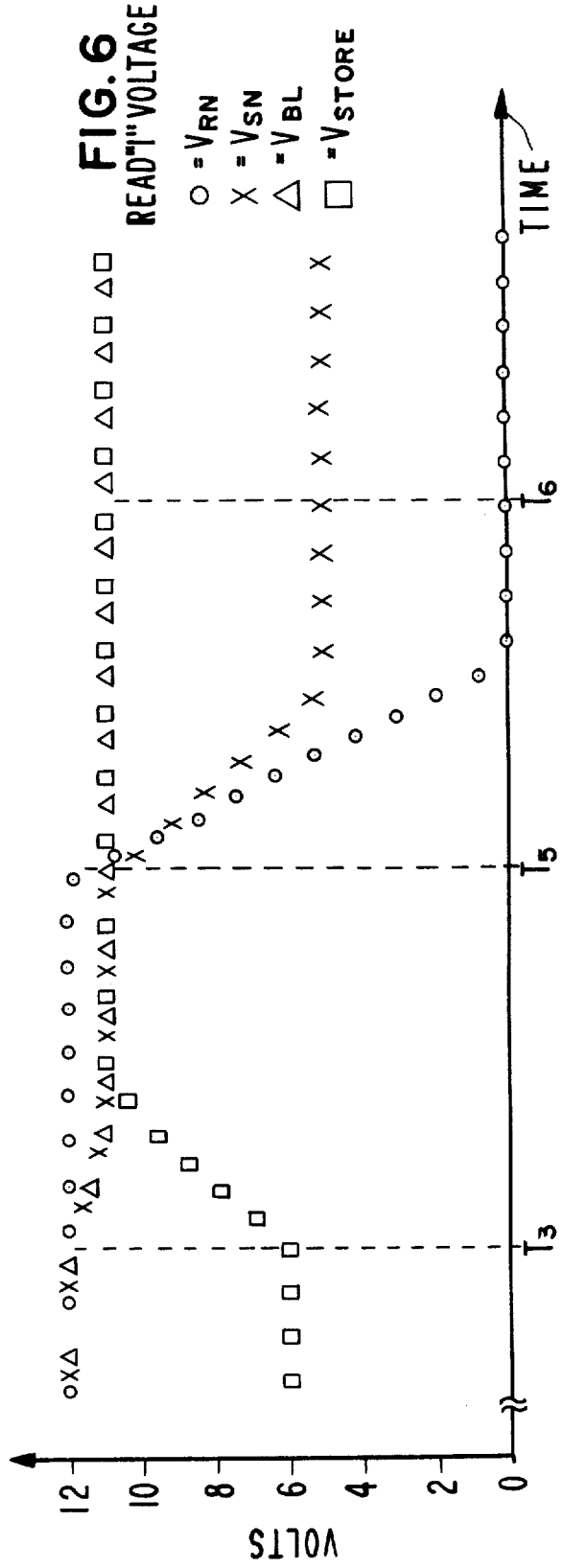

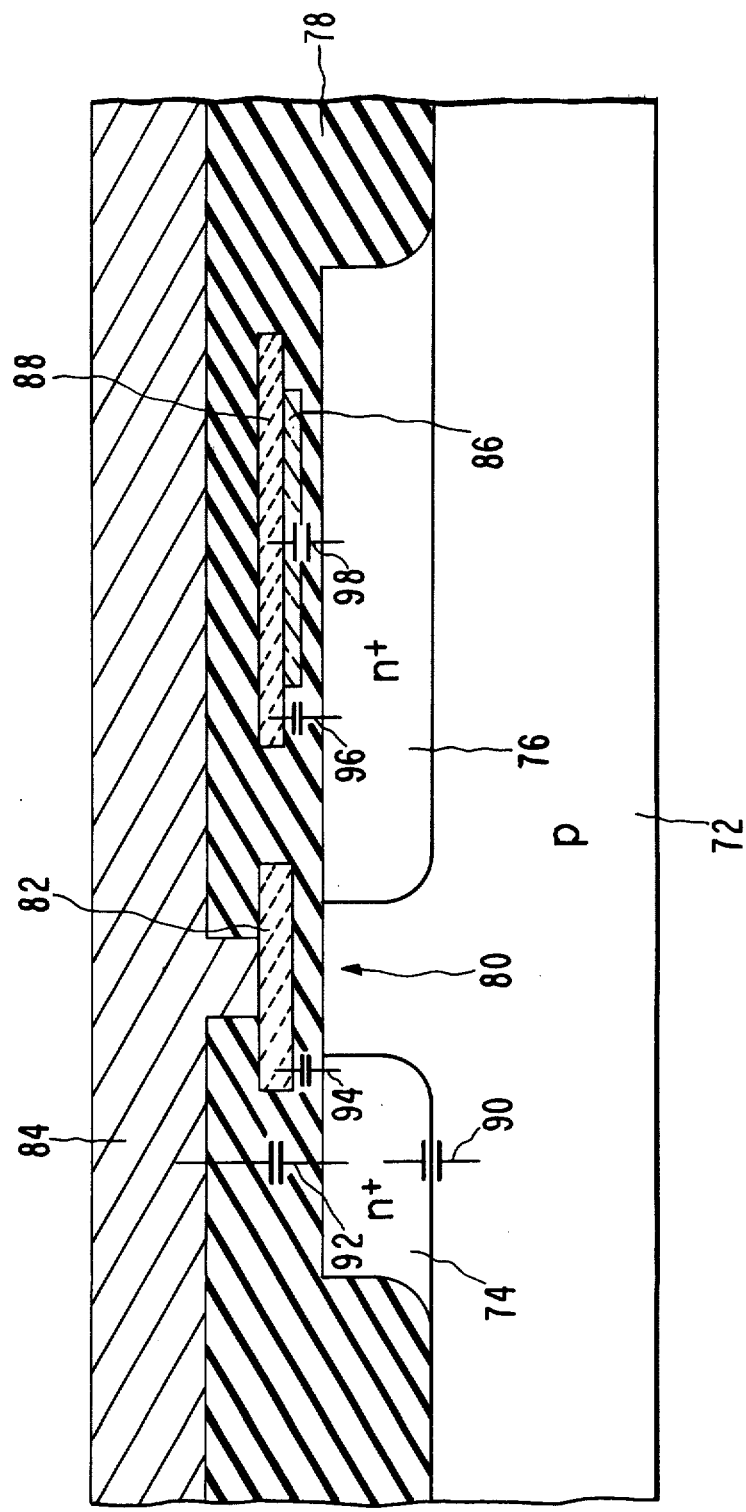

SENSE AMPLIFIER CIRCUIT FOR A RANDOM ACCESS MEMORY

BACKGROUND OF THE INVENTION

1. Field of the Invention

This invention relates generally to electronic memories and specifically to sense amplifiers of the type used with Random Access Memories (RAM's) having 1-transistor memory cells.

2. Prior Art

Considerable attention and effort has been focused on the production of large scale Random Access Memories (RAM's) using N-channel metal-oxide-semiconductor technology. This technology provides the promise of low-cost, moderately-high-speed and high-reliability memory devices of low-power consumption. Although many such memory devices are available commercially, they suffer from a variety of shortcomings and none have managed to fully realize the promise of the technology.

In these large scale RAM's the individual memory cells generally contain one transistor device and a charge storage capacitor. The memory cells are usually formed as part of an integrated circuit in a chip of semiconductor material and are arranged in an array of rows and columns with one sense amplifier often disposed midway along each column of memory cells. Such a configuration as compared to the situation where a sense amplifier is located at the end of each column, allows the inherent bit line capacitance in each column to be balanced at the sense amplifier. While such balancing of capacitance is in itself desirable, it results in the need to employ static circuit techniques which dissipate D.C. power during the operation of the memory to allow "write" and "read-modify-write" operations to be performed.

Process parameter variations associated with the fabrication of electronic memories as integrated circuits result in variations of sense amplifier input signals and the sense amplifier trip-point voltage from wafer to wafer. The trip-point voltage, defined with mathematical rigor hereinbelow, is an input signal voltage somewhat higher than the maximum input signal voltage required to cause the sense amplifier to read the binary state "0" and somewhat lower than the minimum input signal voltage required to cause the sense amplifier to read the binary state "1".

Sense amplifiers known in the prior art that are suitable for location at one end of a column of memory cells do not have built-in tracking capability between the sense amplifier input signal variations and the trip-point voltage variations. Therefore, many processed memory chips are scraped because their sense amplifier trip point voltages and input signal voltages are not properly positioned with respect to one another due to slight process variations. This scrapage, known as yield loss, increases the price of such memories.

Some RAM sense amplifiers use an imbalanced pair of cross-coupled transistors, i.e., one transistor physically larger than the other, to establish the trip-point voltage by regulating the flow of current from a pair of charged nodes. Because the characteristics of MOS transistors are affected by both size and configuration during processing and temperature during operation, the use of a pair of imbalanced transistors creates an inherent process and temperature dependency in the circuit. This is compensated for by imposing more stringent tolerances on the process parameter variations that affect the values of the sense amplifier input voltages and trip-point voltage. These more stringent tolerances result in lower yields and higher costs.

In some memories, each sense amplifier is not completely isolated from the other sense amplifiers. Therefore, when a row of memory cells is activated to interrogate a specific memory cell in a given column, some cross-talking occurs between sense amplifiers and the measurement of charge in the specified memory cell is sensitive to the pattern of information stored as charges in the other activated memory cells.

SUMMARY OF THE INVENTION

The present invention circumvents many o the disadvantages associated with prior art sense amplifiers used in combination with RAM's having one transistor memory cells. It does so by providing a novel sense amplifier circuit and method of fabricating same in which the sense amplifier trip-point voltage is controlled by a pair of capacitances. When a RAM device incorporating the improved sense amplifier circuit of the invention is fabricated as an integrated circuit on a chip of semiconductor material in accordance with the process of the invention, the pair of capacitances used to control the trip-point voltage are formed from circuit elements similar to those which determine the sense amplifier input signal thereby making the trip-point voltage inherently track through a wide range of process parameter variations.

The circuit of the invention avoids inherent thermal and process dependency by using a pair of balanced, substantially identical cross-coupled transistors to measure relative charge at a signal node and a reference node. The circuit includes means for isolating the sense amplifier from a plurality of similar sense amplifiers in a memory array. This feature eliminates cross-talking between the sense amplifiers during the sensing operation. Not only is the sense amplifier of the invention suiable for location at one end of a column of memory cells but it is completely dynamic in that it does not dissipate D.C. power during operation.

BRIEF DESCRIPTION OF THE DRAWINGS

The many objects and advantages of the present invention will become apparent to those skilled in the art when the following description of the best-mode contemplated for practicing the invention is read in conjunction with the accompanying drawings, wherein like reference characters refer to the same or similar elements, and in which:

FIG. 5 is a timing diagram of selected sense amplifier node voltages when the sense amplifier reads "0";

FIG. 6 is a timing diagram of selected sense amplifier node voltages when the sense amplifier reads "1"; and, FIG. 7 is a stylized cross-sectional view of an individual memory cell which has been fabricated using MOS technology.

DETAILED DESCRIPTION OF THE PREFERRED EMBODIMENT

Figure 1:
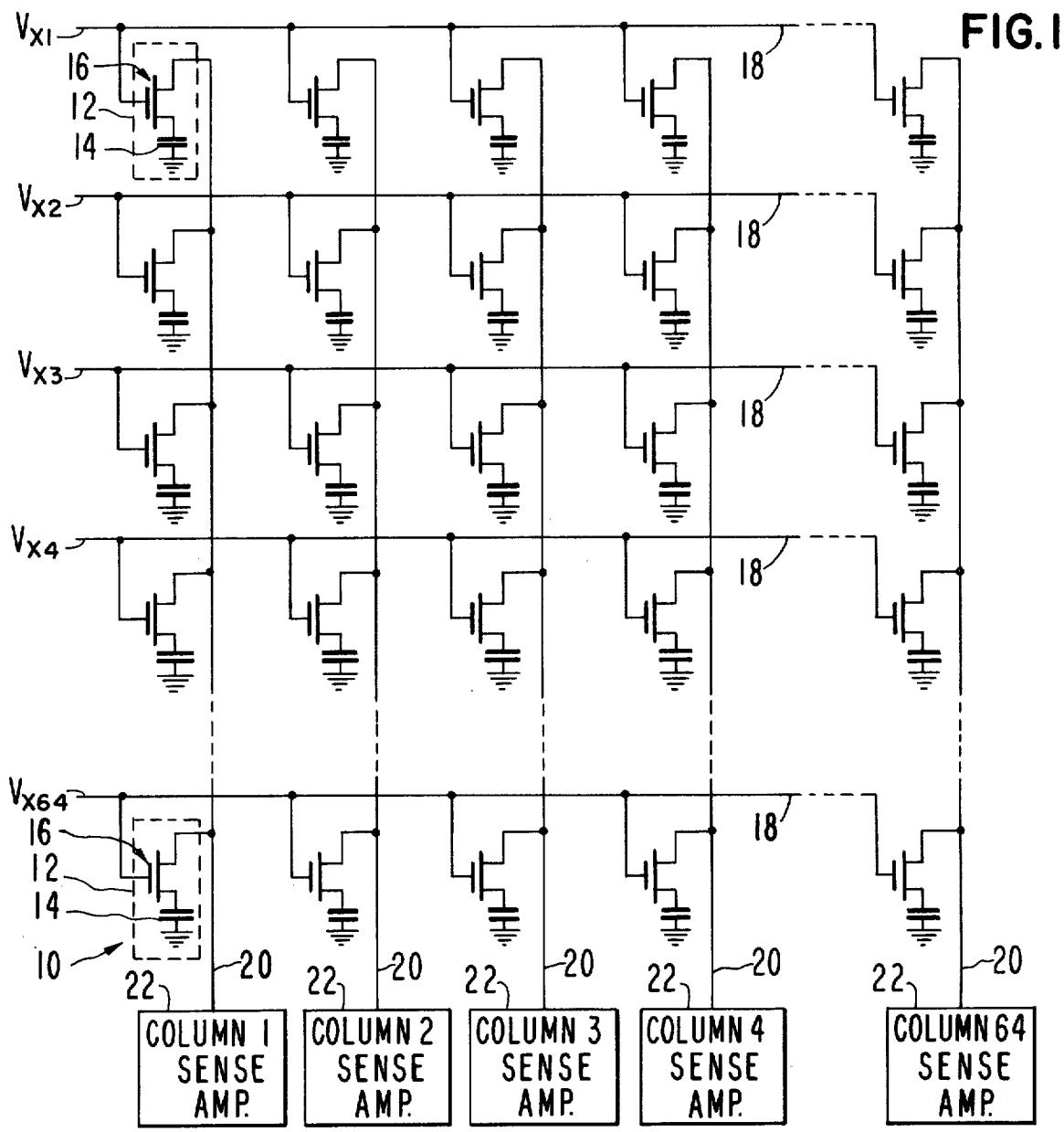
FIG. 1 is a partial schematic diagram of a RAM showing the relationship between individual memory cells and the sense amplifier of the invention.

Referring now generally to the several figures and specifically to FIG. 1, a portion of a RAM circuit 10 capable of storing 4096 bits of information is shown comprised of 4096 substantially identical memory cells 12, each having a storage capacitor 14 and a transistor 16. In the embodiment shown in FIG. 1 these memory cells are disposed in an array having 64 columns and 64 rows. The gate of each transistor 16 in every row of individual memory cells 12 is connected to a row selection line 18. Each individual memory cell 12 in a column is connected to a column bit line 20 which in turn is connected to a sense amplifier 22. In this way, each individual memory cell 12 is uniquely addressed by specifying its row selection line and its column sense amplifier. Sense amplifiers 22 and associated memory cells 12 in each column are substantially identical to those in every other column.

Figure 2:
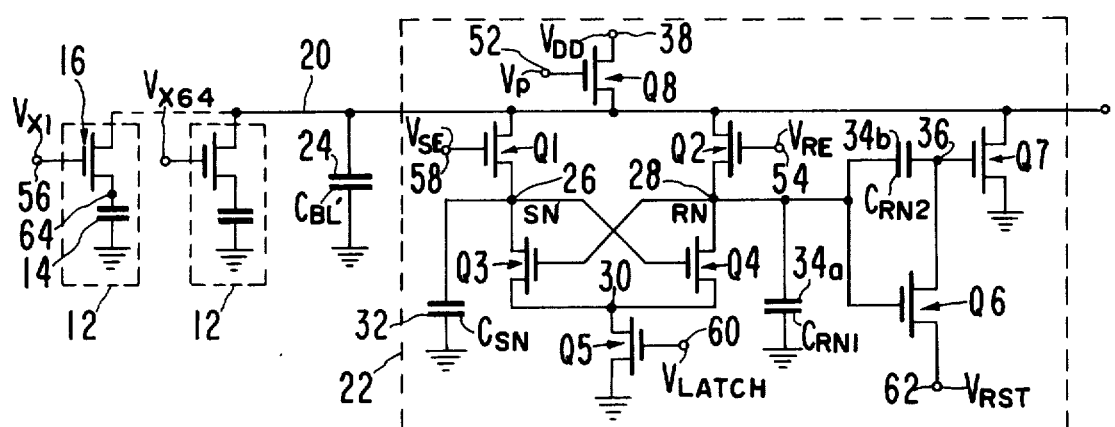
FIG. 2 is a schematic diagram of the sense amplifier circuit.

FIG. 2 shows schematically the memory cells 12 in column 1 connected to their associated bit line 20 and sense amplifier 22. The input signals to and the output signals from a sense amplifier 22 are all present on the amplifier's column bit line 20 at different selected times as will be described in reater detail hereinbelow.

Although it is possible to successfully construct the sense amplifier of the invention from discrete components, the circuit is of far greater utility when fabricated, together with a plurality of memory cells, as an integrated circuit on a chip of semiconductor material. Therefore, throughout this description, only MOS transistors of the type having a gate electrode, a drain and a source will be discussed, though it will be understood by those skilled in the art that bipolar transistors may also be employed. Because of their higher speed of operation, the use of N-channel MOS transistors is preferred although P-channel MOS transistors can also be used.

A pair of transistors Q1 and Q2 have their drains connected to the bit line 20. The source of the transistor Q1 is connected to the drain of a third transistor Q3 forming a signal node 26. The source of the transistor Q2 is connected to the drain of a fourth transistor Q4 forming a reference node 28. The gate electrodes of the transistors Q3 and Q4 are cross-connected to the reference node 28 and the signal node 26, respectively. The sources of the transistors Q3 and Q4 are connected together forming a common source node 30. A fifth transistor Q5 has its drain connected at the common source node 30 and its source connected to ground. A first control capacitance $C_{SN}$ is shown schematically as a capacitor 32 which is connected between the signal node 26 and ground. A second control capacitance $C_{RN}$ is composed of two capacitances $C_{RN1}$ and $C_{RN2}$. Capacitance $C_{RN1}$ is shown schematically as a capacitor 34a connected between the reference node 28 and ground. The capacitance $C_{RN2}$ is shown schematically as a capacitor 34b which is connected between the reference node 28 and a node 36. A sixth transistor Q6 has its drain connected to the node 36 and its gate electrode connected to the node 28. A seventh transistor Q7 has its gate electrode connected to the node 36, its dran connected to the bit line 20 and its source connected to ground. The sense amplifier circuit is completed by an eighth transistor Q8 having its drain connected to a selected positive supply volage of the circuit $V_{DD}$ at a node 38 and its source connected to the bit line 20.

Figure 4:
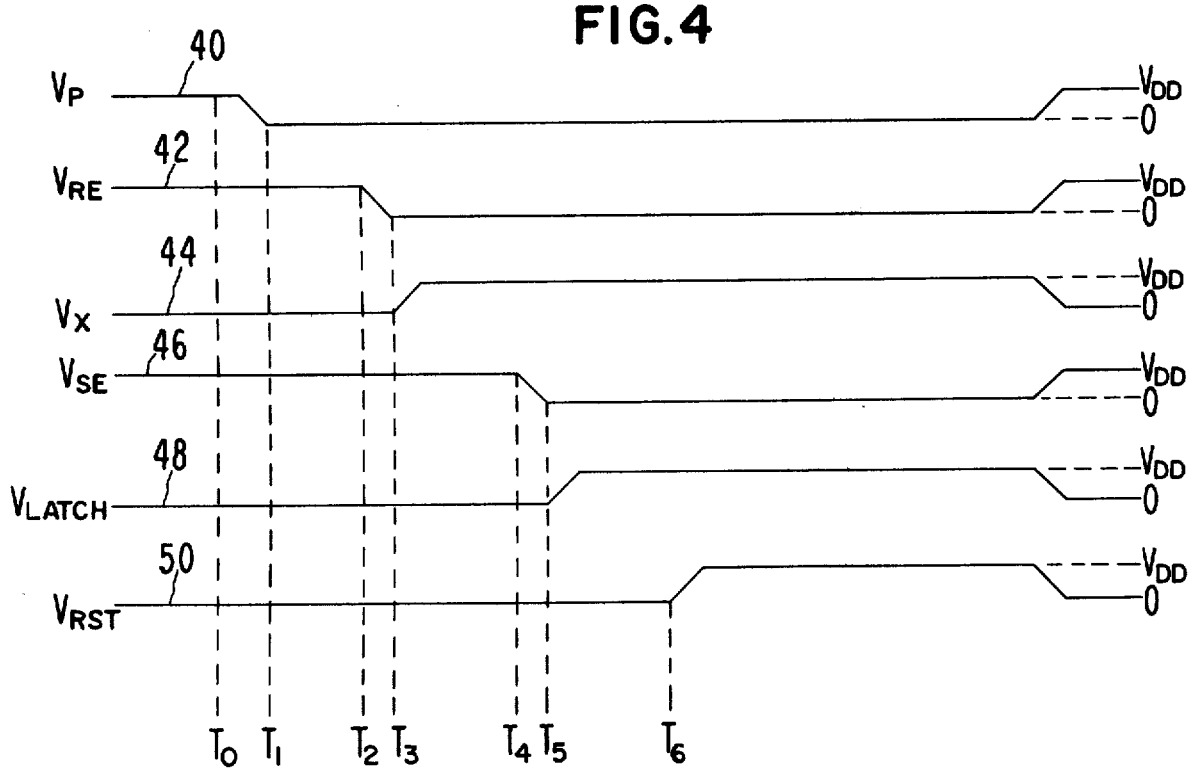
FIG. 4 is a timing diagram of forcing voltages used by the sense amplifier circuit of FIG. 2.

FIG. 4 is a timing diagram showing the relative relationship between forcing voltages $V_P$, $V_{RE}$, $V_X$, $V_{SE}$, $V_{LATCH}$, and $V_{RST}$ represented by waveforms 40, 42, 44, 46, 48 and 50, respectively. The six aforementioned forcing voltages each assume two states, in the circuit shown in FIG. 2 for example, either zero (ground potential) or $V_{DD}$, a selected positive supply voltage of the circuit.

Throughout this description wherever voltage potential variables appear followed by $(T_i)$, where $i$ is a number from 0 to 6, it is to be understood that the identified potentials are referenced at the relative times $T_i$ shown in FIG. 4.

FIGS. 5 and 6 are graphical representations of voltage potantials at four points in the circuit of FIG. 2 during a portion of a read operation. FIG. 5 illustrates the case where the absence of charge, which corresponds to the binary state "0", is detected on the storage capacitor 14 of the memory cell 12 being read by the sense amplifier 22. FIG. 6 illustrates the alterate case where the presence of some minimum charge which corresponds to the binary state "1", is detected by the circuit of FIG. 2. In FIGS. 5 and 6 the waveforms highlighted by circles are representative of the voltage $V_{RN}$ at the reference node 28. The waveforms denoted by crosses are representative of the voltage $V_{SN}$ at the signal node 26. The waveforms shown with triangles are representative of the voltage $V_{BL}$ along the bit line 20. Lastly, the waveforms denoted by squares are representative of the voltage $V_{STORE}$ which is found at a storage node 64 shown in FIG. 2 and is a function of the charge stored in the storage capacitor 14 of the memory cell 12 which is being read by the sense amplifier 22.

At pre-charge time $T_0$, shown in FIG. 4, the bit line 20, the signal node 26 and the reference node 28 are all precharged to the same voltage $V_{PC}=V_{DD}-V_T$ where $V_{DD}$ is a selected positive supply voltage of the circuit and $V_T$ is the threshold voltage of MOS transistors. The transistor Q7 is turned OFF by precharing its gate electrode at the node 36 to ground potential. The common source node 30 is precharged to $V_{PC}-V_T$.

A read operation starts when the forcing voltage $V_P$ applied to the gate electrode of the transistor Q8 at a node 52 and represented by the waveform 40 in FIG. 4, goes low at time $T_1$. This turns the transistor Q8 OFF thereby disconnecting the bit line 20 from the supply voltage $V_{DD}$ at the node 38. At time $T_2$ the forcing voltage $V_{RE}$ applied to the gate electrode of the transistor Q2 at a node 54 and represented by the waveform 42, goes low turning OFF the transistor Q2. The reference node 28 is now isolated from the bit line 20 and the signal node 26. At time $T_3$ the voltage $V_X$ represented by the waveform 44 goes high raising one of the row selection lines 18 to the voltage $V_{DD}$. For purposes of this description it is assumed that the memory cell in row 1 and column 1 is selected. Therefore, the forcing voltage $V_X$ is applied to the gate electrode of the memory cell transistor 16 at a node 56 in FIG. 2 turning the memory cell transistor 16 ON. This allows a redistribution of charge to take place between the storage capacitor 14 in the memory cell 12 having a capacitance $C_{CEL}$ and the capacitance $C_{BL}$ which is the total capacitance on the bit line 20 between the times $T_2$ and $T_3$. $C_{BL}$ is the sum of the capacitances $C_{BL'}$ and $C_{SN}$. $C_{BL'}$ is the total inherent parasitic and device capacitance on the bit line and is represented by the capacitor 24. The total capacitance on the signal node 26 when the transistor Q1 is OFF is a first control capacitance $C_{SN}$ represented by the capacitor 32. As a practical matter, in one embodiment, $C_{SN}$ is quite small compared to $C_{BL'}$ so that $C_{BL'}$ approximates $C_{BL}$. At the end of the redistribution process the storage node 64, the bit line 20 and the signal node 26 are al at the same voltage. This voltage is given by the equation:

$$V_{SN}(T_4) = V_{STORE}(T_4) = V_{BL}(T_4) = \frac{C_{BL} V_{PC} + C_{CBL} V_{STORE}(T_3)}{C_{BL} + C_{CBL}} \quad 1)$$

The maximum stored voltage potential across each of the plurality of storage capacitors 14 is $V_{PC}$. As a slow leakage of charge continually occurs at these capacitors the RAM circuit 10 is provided with means (not shown) for periodically refreshing the charge stored in each memory cell. These memory refresh means insure that the voltage potential across a capacitor 14 in which charge is stored will not fall below ½ $V_{PC}$. Therefore, by substituting this value for $V_{STORE}(T_3)$ in equation (1), the minimum voltage potential at time $T_4$ at the signal node 26 when a charged storage capaacitor 14 is read is designated by $V_{SNH}$ and given by the equation:

$$V_{SNH} = V_{PC} \cdot \frac{(C_{BL} + 0.5 \, C_{CBL})}{C_{BL} + C_{CBL}} \quad 2)$$

Conversely, if no charge was stored in the storage capacitor 14, then $V_{STORE}(T_3) = 0$. substituting this value in equation (1) gives the volage potential $V_{SNL}$, the voltage at time $T_4$ at the signal node 26 when the binary state "0" is read:

$$V_{SNL} = \frac{C_{BL} V_{PC}}{C_{BL} + C_{CBL}} \quad 3)$$

At time $T_4$, the forcing voltage $V_{SE}$ applied to the gate electrode of the ransistor Q1 at a node 58 and represented by the waveform 46 in FIG. 4 goes low. This turns OFF the transistor Q1 thereby to isolate the signal node 26 from the bit line 20.

At time $T_5$, the forcing voltage $V_{LATCH}$ applied to the gate electrode of the transistor Q5 at a node 60 and represented by the waveform 48 goes high turning ON the transistor Q5. The common source node 30 is quickly discharged through the tansistor Q5 to ground. The charges on the signal node 26 and the reference node 28 then discharge through the transistors Q3 and Q4 respectively in the following manner. The transistors Q3 and Q4 are substantially identical and affected equally by any temperature fluctuations and manufacturing process parameter variations. Therefore, all else being equal, the rate of current flow through the transistors Q3 and Q4 is substantially identical. However, the relative rate of discharge at the signal node 26 and the reference node 28 is governed by the amounts of charge present at these nodes. The amount of charge at the signal node 26 is a function of the first control capacitance $C_{SN}$ represented by the capacitor 32 and the signal node voltage $V_{SN}(T_5)$. Correspondingly, the amount of charge at the reference node 28 is a function of the second control capacitance $C_{RN}$ shown as the sum of capacitors 34a and 34b and the reference node volage $V_{RN}(T_5)$. As mentioned above, the node 36 is precharged to ground potential and remains so during this discharge process. Therefore, the capacitors 34a and 34b act as though they were connected in parallel.

The values of $C_{SN}$ and $C_{RN}$ are chosen so that if the binary state "0" is read and $V_{SN}(T_4) = V_{SNL}$, then, as is clearly shown in FIG. 5, the poential $V_{SN}$ falls quickly to ground between times $T_5$ and $T_6$ turning OFF the transistor Q4 which leaves a residual charge having a potential $V_{RN}(T_6) < V_T$ at the reference node 28. Furthermore, the values for $C_{SN}$ and $C_{RN}$ are such that when the binary state "1" is read and $V_{SN}(T_4) = V_{SNH}$, then, as is correspondingly shown in FIG. 6, the additional charge at the signal node 26 is sufficient to hold the transistor Q4 ON long enough to discharge the reference node 28 to some voltage less than the MOS transistor threshold voltage $V_T$, turning the transistor Q3 OFF and leaving a residual voltage $V_{SN}(T_6)$ isolated at the signal node 26. $V_{SN}(T_6)$ is greater than $V_T$ whereby, the transistor Q4 is held ON and the reference node 28 is discharged to ground potential.

At time $T_6$, the forcing voltage $V_{RST}$ applied to the source of the transistor Q6 at a node 62 and represented by the waveform 50 in FIG. 4 goes high. If the binary state "0" has been detected, then the residual charge stored at the reference node 28 with potential $V_{RN}(T_6) < V_T$, allows current from the node 62 to conduct through the transistor Q6 to the node 36. This conduction of current through the transistor Q6 allows the capacitance $C_{RN2}$ represented by the capacitor 34b to bootstrap the transistor Q6 into a fully ON condition by raising the potential $V_{RN}$ at the reference node 28.

As the gate voltage of the transistor Q7 at the node 36 rises above $V_T$, the transistor Q7 is turned ON and the bit line 20 is discharged to ground, allowing the binary state "0" to be read from the bit line amplifier 22. Since the forcing voltage $V_X$ applied to the node 56 and represented by the waveform 44 is still high, the memory cell transistor 16 is still ON. Therefore, the storage capacitor 14 is still connected to the bit line 20 and voltage potential $V_{STORE}$ follows $V_{BL}$ down to ground potential, restoring the binary state "0" to the memory cell 12.

If the binary state "1" had been detected, then the reference node 28 and the connected gate electrode of the transistor Q6 would be at ground potential. The transistors Q6 and Q7 would be unaffected by the presence of the forcing voltage $V_{RST}$ at the node 62 and would both remain OFF. Therefore, the voltage potential $V_{BL}$ on the bit line 20 and the memory storage capacitor voltage $V_{STORE}$ on the storage capacitor 14 would remain high, allowing the binary state "1" to be read from the sense amplifier 22.

During one read operation all the memory cells 12 activated by the specified row selection line 18 are simultaneously read and refreshed by the plurality of column sense amplifiers 22. The transistor Q5 associated uniquely with each sense amplifier provides an isolated direct path to ground for its associated common source node 30. Thus, no cross-talking occurs between sense amplifiers and the rate of charge dissipation at each of the common source nodes 30 is not sensitive to the pattern of information stored as charges in the other activated memory cells 12.

The sense amplifier trip-point voltage $V_{TR}$ is defined as that voltage at the signal node 26 such that if $V_{SN}(T_5) = V_{TR} + \delta$ the sense amplifier 22 would read the binary state "1", and if $V_{SN}(T_5) = V_{TR} - \delta$ it would read the binary state "0". It is understood that $\delta$ can be infinitely smal. It is clear from the foregoing description of the circuit operation and definition that the trip-point voltage increases as it becomes more difficult for the sense amplifier 22 to read the binary state "1". The sense amplifier 22 reads the binary tate "1" only when the reference node 28 has been discharged to ground potential at time $T_6$. The reference node 28 is more difficult to discharge when the second control capacitance $C_{RN}$ is increased or when the first control capacitance $C_{SN}$ is decreased. Therefore, the trip-point voltage at the signal node 26 is governed by the following relationship:

$$V_{TR} \; \frac{C_{RN}}{C_{SN}} \qquad 4).$$

Equations (2) and (3) above which characterize the voltage potentials $V_{SNH}$ and $V_{SNL}$, respectively, may be rearranged as follows:

$$V_{SNH} = \frac{V_{PC} \left( \frac{C_{BL}}{C_{CEL}} + 0.5 \right)}{\frac{C_{BL}}{C_{CEL}} + 1} \qquad 5).$$

$$V_{SNL} = \frac{V_{PC} \left( \frac{C_{BL}}{C_{CEL}} \right)}{\frac{C_{BL}}{C_{CEL}} + 1} \qquad 6).$$

As defined above, $V_{SNH}$ is the minimum voltage potential at the signal node 26 at time $T_4$ when the binary state "1" was stored. $V_{SNL}$ is the voltage at the signal node 26 at time $T_4$ when the binary state "0" (no charge) has been stored in the memory cell. It is clear from the equations (5) and (6) that both $V_{SNH}$ and $V_{SNL}$ increase as the ratio of $C_{BL}/C_{CEL}$ increases. This relationship is shown graphically in FIG. 3 wherein the voltage potentials of $V_{SNH}$ and $V_{SNL}$ are depicted by a pair of curves 66 and 68 respectively. These curves 66 and 68 clearly shown the dependence of the voltage potentials $V_{SNH}$ and $V_{SNL}$ on the ratio of $C_{BL}/C_{CEL}$. This dependency of the input signal voltages on $C_{BL}$ and $C_{CEL}$ is given by the equation:

$$V_{SN}(T_5) \; \alpha \; \frac{C_{BL}}{C_{CEL}} \qquad 7).$$

In any known MOS process used to manufacture the memory cells 12 and sense amplifiers 22 of the RAM 10 on a integrated chip, the value of $C_{BL}/C_{CEL}$ varies from run to run and wafer to wafer and hence the values of $V_{SNH}$ and $V_{SNL}$ vary from run to run and wafer to wafer. Therefore, it is highly undesirable to use a sense amplifier wherein the trip-point voltage remains constant as $C_{BL}/C_{CEL}$ varies. Ideally, the trip-point voltage should lie equidistant between $V_{SNL}$ and $V_{SNH}$ and vary proportionately with these voltages over a wide range of $C_{BL}/C_{CEL}$ values.

Figure 3:
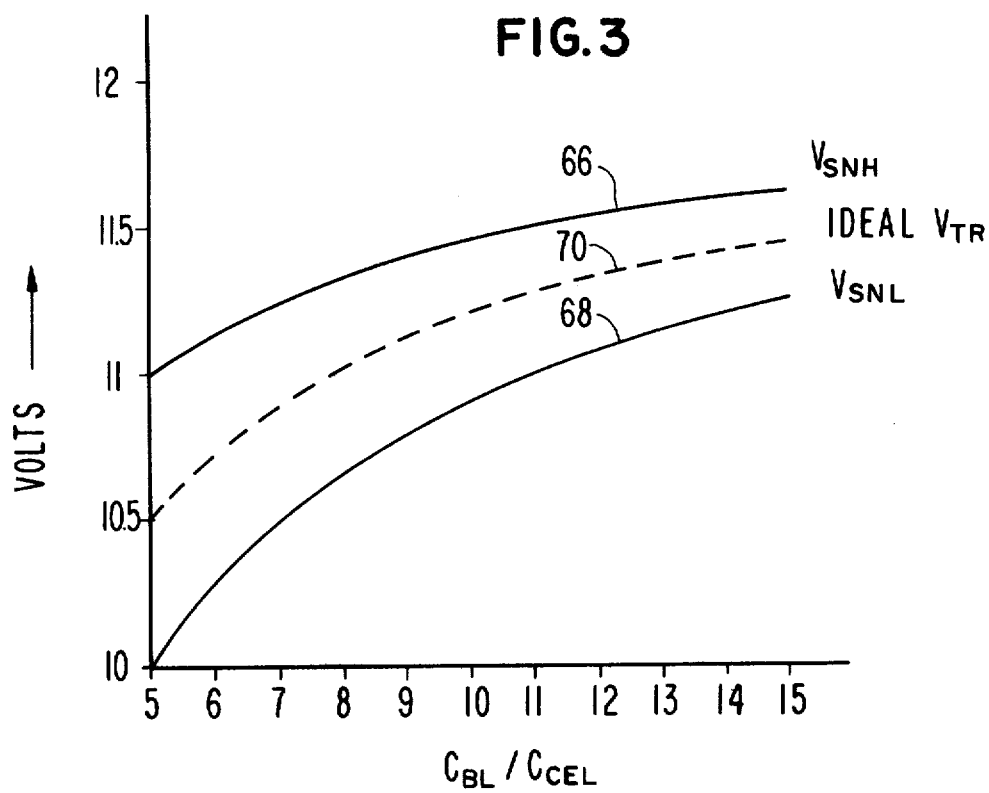
FIG. 3 is a graph illustrating the effect of process parameter variations on sense amplifier input voltages.

Such an ideal sense amplifier trip-point voltage $V_{TR}$ is represented graphically by a curve 70 in FIG. 3. From the equation (4) it is clear that the value of $V_{TR}$ is directly proportional to $C_{RN}/C_{SN}$, and from the equation (7) it is clear that the value of $V_{SN}(T_5)$ is directly proportional to $C_{BL}/C_{CEL}$. Therefore, the sense amplifier trip-point voltage $V_{TR}$ will vary proportionally or "track" with the sense amplifier input voltage $V_{SN}(T_5)$ if the second control capacitance $C_{RN}$ varies as the bit line capacitance $C_{BL}$ varies and if the first control capacitance $C_{SN}$ changes in the same way the memory storage capacitance $C_{CEL}$ changes. This invention can be implemented with particular ease using integrated circuit technology.

The invention is incorporated in integrated circuit form as part of Fairchild's 4096 bit RAM model no. 3540. The individual memory cells 12 in this circuit are structured substantially as shown in the stylized cross-sectional view of FIG. 7. In FIG. 7 a P-type semiconductor substrate 72 has a pair of N+ regions 74 and 76 which were formed by the diffusion of N-type impurities into the semiconductor substrate 72. The N+ region 74 is highly conductive and corresponds to the bit line 20. The N+ region 76 is also highly conductive and corresponds to the electrode of the storage capacitor 14 connected to the transistor 16 at the node 64. An insulating layer of silicon dioxide $SiO_2$ is shown generally at 78. Among other functions this silicon dioxide layer 78 insulates a channel region 80 in the semi-conductor substrate 72 from a gate electrode 82 formed from polysilicon. This polysilicon gate 82 makes electrical contact with a metallic conductor 84 which corresponds to a row selection line 18 shown in FIG. 1. A thin layer of silicon nitride 86 ($Si_3N_4$) is shown disposed above but insulated from the diffused N+ region 76. Immediately above and in overlapping contact with the silicon nitride layer 86 is apolysilicon layer 88 which corresponds to the electrode of the capacitor 14 connected to ground potential. The inherent bit line capacitance $C_{BL}$, shown in FIG. 2 as the capacitor 24, arises from the structure of the memory cell shown in FIG. 7 and is comprised of capacitances represented by three superimposed capacitor symbols 90, 92 and 94. The capacitor symbol 90 represents diffusion capacitance between the P-type semiconductor substrate 72 and the diffused N+ region 74. The capacitance represented by the capacitor symbol 92 arises between the metallic conductor 84 and the diffused N+ region 74. The third capacitance represented by the capacitor symbol 94 is gate oxide capacitance which arises between the two N+ regions 74 and 76 and the polysilicon gate 82. The memory cell storage capacitance $C_{CEL}$ is comprised of two types of capacitance shown in FIG. 7 as the superimposed capacitor symbols 96 and 98. The capacitance represented by the symbol 96 is gate oxide capacitance between the diffused N+ region 76 and the portion of the polysilicon electrode layer 88 overhanging the silicon nitride layer 86. The capacitor symbol 98 represents the nitride capacitance which arises between the polysilicon electrode 88 and the diffused N+ region 76 where these elements are separated by an insulating layer of silicon nitride 86 and a layer of silicon dioxide 78.

Ideally, the second control capacitance $C_{RN}$ (not shown in FIG. 7) is comprised of proportional parts of the same types of capacitances which comprise $C_{BL}$. These proportional parts are not only structured similarly but are also formed concurrently with the corresponding structures comprising $C_{BL}$. Similarily, the first control capacitance $C_{SN}$ (also not shown in FIG. 7) is comprised of proportional parts of the same types of capacitances which comprise $C_{CEL}$, where the corresponding structures are also formed concurrently. By employing the design techniques described above, the values of $C_{BL}$ and $C_{RN}$ change proportionately with manufacturing process parameter variations as do the values of $C_{CEL}$ and $C_{SN}$. Equations (4) and (7) clearly show that where the above conditions exist the sense amplifier trip point-voltage $V_{TR}$ tracks with the sense amplifier input signal voltages $V_{SN}(T_5)$ over a wide range of manufacturing process parameter variations.

Although the ideal component proportions are disclosed above, it will be understood that other proportions are operative. For example, in Fairchild's 4096 bit RAM model no. 3540, the bootstrap capacitance $C_{RN2}$ shown as capacitor 34b in FIG. 2 is made most efficiently with gate oxide capacitance. Therefore, this component is disproportionally large in $C_{RN}$. This is compensated for by adding a larger proportion of gate oxide capacitance to $C_{SN}$.

From the foregoing detailed description it will be evident that there are a number of changes, adaptions, and modifications of the present invention which come within the provence of those skilled in the art; however, it is intended that all such variations not departing from the spirit of the invention be considered as within the scope thereof as limited solely by the appended claims.

I claim:

1. In combination with an electronic memory of the type having a plurality of substantially identical memory cells each comprised of one transistor and a charge storage capacitor, where a plurality of such memory cells are connected to a common bit line having an inherent bit line capacitance, an improved sense amplifier comprising:
   a first and second transistor each having a gate electrode, a drain and a source, said first gate electrode connected to said second drain, forming a reference node, said second gate electrode connected to said first drain forming a signal node;
   a first control capacitance operatively connected between said signal node and ground;
   a second control capacitance operatively connected between said reference node and ground, whereby the minimum input signal voltage required to cause said improved sense amplifier to read the binary state "1" is controlled by the magnitudes of said first and second capacitances;
   charge sensitive means connected to said reference node for selectively rounding said common bit line; and,
   a third and fourth transistor forming bit line connection means for selectively connecting said signal node and said reference node to said common bit line, each having a gate electrode, a drain and a source, said third and fourth drains connected to said common bit line, said third and fourth sources connected to said signal node and said reference node, respectively, and said third and fourth gate electrodes being disposed for receiving control voltages.

2. The combination of claim 1 fabricated as an integrated circuit.

3. The combination of claim 2 wherein said storage capacitors in said memory cells and said first control capacitance are formed from proportional amounts of the same materials and said inherent bit line capacitance and said second control capacitance are formed from proportional amounts of the same materials, whereby the minimum input signal voltage required to cause the sense amplifier to read the binary state "1" tracks with the sense amplifier input signal voltage over a wide range of manufacturing process parameter variations.

4. The combination of claim 2 wherein said first control capacitance comprises nitride capacitance and gate oxide capacitance and said second control capacitance comprises diffusion capacitance, metal to N+ capacitance and gate oxide capacitance.

5. The combination of claim 1 additionally comprising:
   common discharge means for selectively connecting said first and second sources to round.

6. The combination of claim 5 wherein said common discharge means comprises:
   a fifth transistor with a gate electrode, a drain and a source, said fifth drain connected to said first and second sources, and said fifth source connected to ground.

7. The combination of claim 1 wherein said charge sensitive means comprises:
   a sixth and seventh transistor each having a gate electrode, a drain and a source, said sixth gate electrode connected to said reference node, said seventh drain connected to said common bit line, said seventh source connected to ground; and,
   a capacitor connected between said reference node and a node formed by the connection of said seventh gate electrode and said sixth drain.

8. The combination of claim 1 additionally comprising:
   precharging means connected to said common bit line for selectively charging said common bit line.

9. The combination of claim 8 wherein said precharging means comprises:
   power supply means; and,
   an eighth transistor having a gate electrode, a drain and a source, said eighth source connected to said common bit line and said eighth drain connected to said power supply means.

10. The combination of claim 8 additionally comprising:
    circuit control means for selectively applying predetermined forcing voltages to said precharging means, said charge sensitive means, said common discharge means, said bit line connection means, and the gate electrode of a selected memory cell transistor.

11. The combination of claim 10 fabricated as an integrated circuit.

* * * * *